(12) United States Patent
Khlat

(10) Patent No.: US 11,025,458 B2
(45) Date of Patent: Jun. 1, 2021

(54) ADAPTIVE FREQUENCY EQUALIZER FOR WIDE MODULATION BANDWIDTH ENVELOPE TRACKING

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/774,060

(22) Filed: Jan. 28, 2020

(65) Prior Publication Data

US 2020/0259685 A1 Aug. 13, 2020

Related U.S. Application Data

(60) Provisional application No. 62/802,286, filed on Feb. 7, 2019.

(51) Int. Cl.
| | |
|---|---|
| *H04W 88/08* | (2009.01) |
| *H04L 25/03* | (2006.01) |
| *H03F 3/24* | (2006.01) |
| *H03F 1/02* | (2006.01) |
| *H04B 1/04* | (2006.01) |

(52) U.S. Cl.
CPC ..... *H04L 25/03828* (2013.01); *H03F 1/0233* (2013.01); *H03F 3/245* (2013.01); *H04B 1/0475* (2013.01); *H03F 2200/105* (2013.01); *H03F 2200/129* (2013.01); *H03F 2200/451* (2013.01); *H04W 88/085* (2013.01)

(58) Field of Classification Search
USPC .......................... 375/232; 330/127, 297, 291
See application file for complete search history.

(56) References Cited

U.S. PATENT DOCUMENTS

| | | | |
|---|---|---|---|
| 5,838,732 A | 11/1998 | Carney | |
| 6,107,862 A | 8/2000 | Mukainakano et al. | |

(Continued)

FOREIGN PATENT DOCUMENTS

EP   3174199 A2   5/2017

OTHER PUBLICATIONS

Non-Final Office Action for U.S. Appl. No. 14/836,634, dated May 16, 2016, 9 pages.

(Continued)

*Primary Examiner* — Eva Y Puente
(74) *Attorney, Agent, or Firm* — Withrow & Terranova, P.L.L.C.

(57) ABSTRACT

An adaptive frequency equalizer for wide modulation bandwidth envelope tracking (ET) is provided. In this regard, an ET integrated circuit (ETIC) provides an ET power signal for one or more power amplifiers (PAs). A voltage error can occur in the ET power signal due to variable impedance sources, such as a variable load impedance at the PA and a variable trace inductance between the ETIC and the PA. The adaptive frequency equalizer disclosed herein works to adaptively correct for such voltage errors to provide improved overall power signal tracking at the PA, especially where there is a large trace inductance from the ETIC being located several centimeters (cm) away from the PA. Thus, embodiments of the adaptive frequency equalizer enhance ET performance for radio frequency (RF) systems having a modulation bandwidth of 100 megahertz (MHz) or above.

20 Claims, 14 Drawing Sheets

(56) References Cited

U.S. PATENT DOCUMENTS

| | | | |
|---|---|---|---|
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 8,493,141 B2 | 7/2013 | Khlat et al. |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 * | 10/2018 | Henzler ............. H03F 3/24 |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 * | 2/2015 | Vinayak ............. H03F 3/211 |
| | | 330/127 |
| 2015/0071382 A1 | 3/2015 | Wu et al. |
| 2015/0098523 A1 | 4/2015 | Lim et al. |
| 2015/0155836 A1 * | 6/2015 | Midya ............. H03F 1/0222 |
| | | 330/291 |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 * | 5/2016 | Shute ............. H04L 25/03834 |
| | | 330/297 |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0238095 A1 | 8/2019 | Khlat |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |

(56) References Cited

U.S. PATENT DOCUMENTS

| | | | |
|---|---|---|---|
| 2020/0106392 | A1 | 4/2020 | Khlat et al. |
| 2020/0136561 | A1 | 4/2020 | Khlat et al. |
| 2020/0136563 | A1 | 4/2020 | Khlat |
| 2020/0136575 | A1 | 4/2020 | Khlat et al. |
| 2020/0144966 | A1 | 5/2020 | Khlat |
| 2020/0153394 | A1* | 5/2020 | Khlat ................ H03F 3/20 |
| 2020/0177131 | A1 | 6/2020 | Khlat |
| 2020/0204116 | A1 | 6/2020 | Khlat |
| 2020/0228063 | A1 | 7/2020 | Khlat |
| 2020/0259456 | A1 | 8/2020 | Khlat |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
U.S. Appl. No. 16/514,051, filed Jul. 17, 2019.
U.S. Appl. No. 16/689,236, filed Nov. 20, 2019.
U.S. Appl. No. 16/435,940, filed Jun. 10, 2019.
Notice of Allowance for U.S. Appl. No. 16/155,127, dated Jun. 1, 2020, 8 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Final Office Action for U.S. Appl. No. 16/122,611, dated Sep. 18, 2020, 17 pages.
Final Office Action for U.S. Appl. No. 15/888,300, dated Feb. 15, 2019, 15 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 161689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.

* cited by examiner

ADAPTIVE FREQUENCY EQUALIZER FOR WIDE MODULATION BANDWIDTH ENVELOPE TRACKING

RELATED APPLICATIONS

This application claims the benefit of provisional patent application Ser. No. 62/802,286, filed Feb. 7, 2019, the disclosure of which is hereby incorporated herein by reference in its entirety.

FIELD OF THE DISCLOSURE

This disclosure is related to envelope tracking (ET) power supplies for radio frequency (RF) devices.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The enhanced user experiences require a higher data rate to be offered by wireless communication technologies, such as fifth generation new radio (5G-NR) and Wi-Fi, which typically operate in higher frequency spectrums. Notably, radio frequency (RF) signals transmitted in these higher frequency ranges are more susceptible to propagation attenuation and interference and require a wider modulation bandwidth, such as a 100 megahertz (MHz) or higher modulation bandwidth. This, in turn, may require more sophisticated power amplifiers (PAs) to increase output power of the RF signals (e.g., maintaining sufficient energy per bit) prior to transmitting the RF signals.

Envelope tracking (ET) is a power management technology designed to improve efficiency levels of the PAs to help reduce power dissipation in the mobile communication devices. As the name suggests, an ET circuit is configured to generate a modulated voltage that keeps track of a target voltage envelope and provide the modulated voltage to the PAs for amplifying the RF signal(s). The better the ET voltage tracks the amplitude of the RF signal(s), the higher efficiency can be achieved in the PAs. With the higher modulation bandwidths in higher frequency RF signals, the ET voltage can experience tracking errors, especially when the ET circuit is located several centimeters away from the PA, resulting in a large trace inductance. Such tracking errors can result in decreased efficiency of the PAs and/or undesirable distortions in RF signals amplified by the PAs.

SUMMARY

An adaptive frequency equalizer for wide modulation bandwidth envelope tracking (ET) is provided. In this regard, an ET integrated circuit (ETIC) provides an ET power signal for one or more power amplifiers (PAs). A voltage error can occur in the ET power signal due to variable impedance sources, such as a variable load impedance at the PA and a variable trace inductance between the ETIC and the PA. The adaptive frequency equalizer disclosed herein works to adaptively correct for such voltage errors to provide improved overall power signal tracking at the PA, especially where there is a large trace inductance from the ETIC being located several centimeters (cm) away from the PA. Thus, embodiments of the adaptive frequency equalizer enhance ET performance for radio frequency (RF) systems having a modulation bandwidth of 100 megahertz (MHz) or above.

An exemplary embodiment provides an RF circuit. The RF circuit includes a power supply and an ETIC coupled to the power supply and configured to provide an envelope tracked power signal to a PA. The RF circuit further includes an adaptive frequency equalizer configured to inject an error correcting signal into the ETIC, the error correcting signal compensating for a voltage tracking error in the envelope tracked power signal due to a variable load impedance at the PA and a variable trace inductance between the ETIC and the PA.

Another exemplary embodiment provides a method for correcting errors in wide modulation bandwidth envelope tracking. The method includes receiving a modulated target voltage signal; providing an envelope tracked power signal using an ETIC for a PA based on the modulated target voltage signal; and injecting an error correcting signal into the ETIC. The error correcting signal compensates for a voltage tracking error in the envelope tracked power signal due to a variable load impedance at the PA and a variable trace inductance between the ETIC and the PA.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
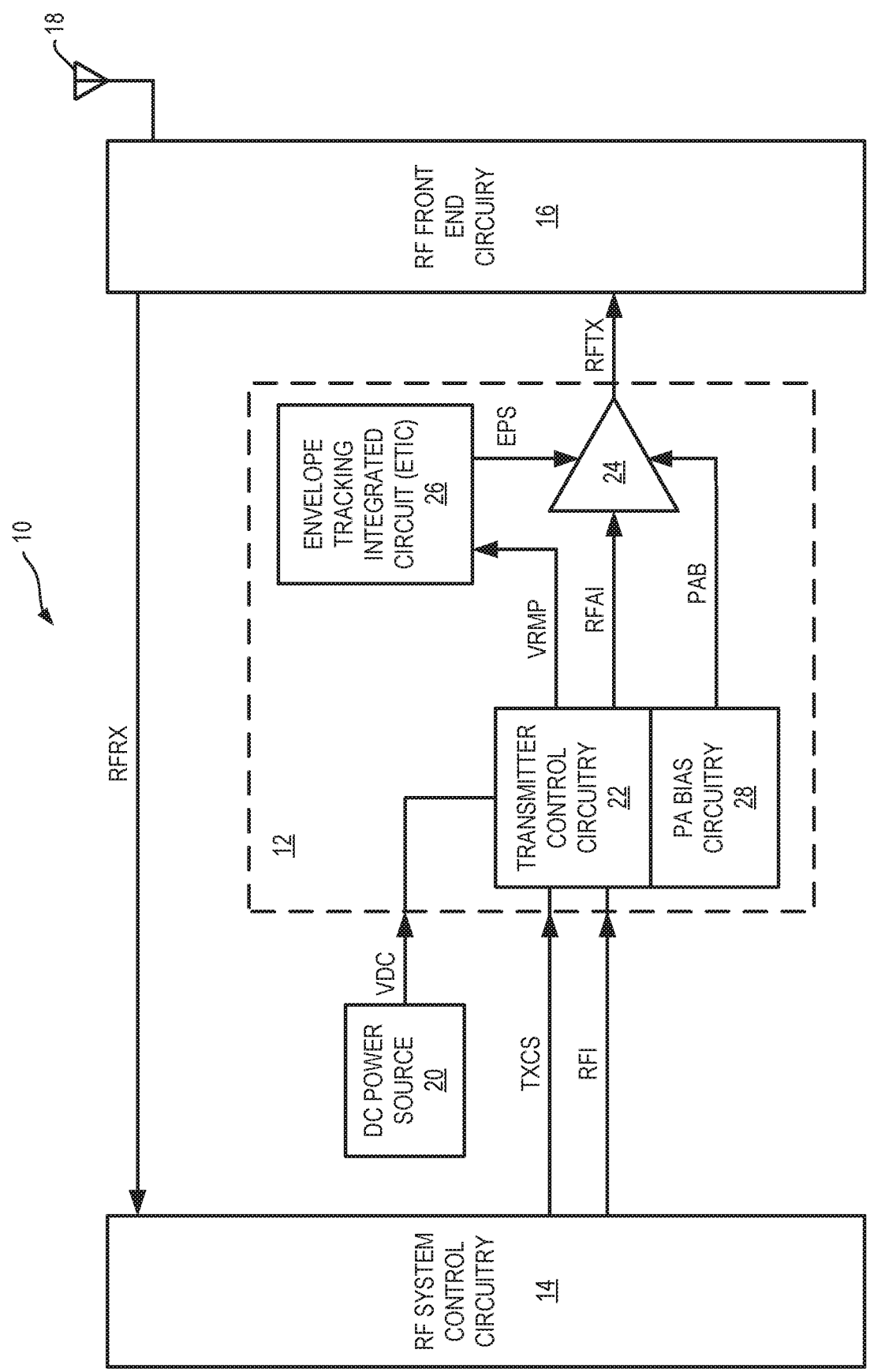
FIG. 1 is a block schematic diagram of an exemplary radio frequency (RF) communications system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An adaptive frequency equalizer for wide modulation bandwidth envelope tracking (ET) is provided. In this regard, an ET integrated circuit (ETIC) provides an ET power signal for one or more power amplifiers (PAs). A voltage error can occur in the ET power signal due to variable impedance sources, such as a variable load impedance at the PA and a variable trace inductance between the ETIC and the PA. The adaptive frequency equalizer disclosed herein works to adaptively correct for such voltage errors to provide improved overall power signal tracking at the PA, especially where there is a large trace inductance from the ETIC being located several centimeters (cm) away from the PA. Thus, embodiments of the adaptive frequency equalizer enhance ET performance for radio frequency (RF) systems having modulation bandwidth of 100 megahertz (MHz) or above.

FIG. 1 is a block schematic diagram of an exemplary RF communications system 10. The RF communications system 10 includes RF transmitter circuitry 12, RF system control circuitry 14, RF front-end circuitry 16, an RF antenna 18, and a direct current (DC) power source 20. The RF transmitter circuitry 12 includes transmitter control circuitry 22, an RF PA 24, an ETIC 26, and PA bias circuitry 28.

In one embodiment of the RF communications system 10, the RF front-end circuitry 16 receives via the RF antenna 18, processes, and forwards an RF receive signal RFRX to the RF system control circuitry 14. The RF system control circuitry 14 provides a transmitter configuration signal TXCS and an RF input signal RFI to the transmitter control circuitry 22. Based on the RF input signal RFI and the transmitter configuration signal TXCS, the transmitter control circuitry 22 provides an RF amplifier input signal RFAI to the RF PA 24. The DC power source 20 provides a DC source signal VDC to the RF transmitter circuitry 12 (e.g., via transmitter control circuitry 22). In this manner, the DC power source 20 provides power to components of the RF transmitter circuitry 12, such as the transmitter control circuitry 22, the RF PA 24, the ETIC 26, and the PA bias circuitry 28. In one embodiment of the DC power source 20, the DC power source 20 is a battery.

In an exemplary aspect, the transmitter control circuitry 22 includes an ET look-up table (LUT) for generating an envelope power supply control signal VRMP based on the RF input signal RFI and the transmitter configuration signal TXCS. The ET LUT may include storage elements (e.g., registers) for storing predetermined target voltages in association with amplitudes of the transmitter configuration signal TXCS. The ET LUT may further include an application-specific integrated circuit (ASIC) or another appropriate processor to generate the envelope power supply control signal VRMP (e.g., a modulated target voltage signal) for the ETIC 26, which may be a differential voltage signal.

The ETIC 26 provides an envelope power supply signal EPS to the RF PA 24 based on the envelope power supply control signal VRMP. The envelope power supply control signal VRMP is representative of a set point of the envelope power supply signal EPS. The RF PA 24 receives and amplifies the RF amplifier input signal RFAI to provide an RF transmit signal RFTX using the envelope power supply signal EPS. The envelope power supply signal EPS provides power for amplification. The RF front-end circuitry 16 receives, processes, and transmits the RF transmit signal RFTX via the RF antenna 18. In one embodiment of the RF transmitter circuitry 12, the transmitter control circuitry 22 configures the RF transmitter circuitry 12 based on the transmitter configuration signal TXCS.

The transmitter control circuitry 22 is coupled to the PA bias circuitry 28. The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal TXCS. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF communications system 10, the RF communications system 10 communicates with other RF communications systems (not shown) using multiple communications slots, which may include transmit communications slots, receive communications slots, simultaneous receive and transmit communications slots, or any combination thereof. Such communications slots may utilize the RF transmit signal RFTX, the RF receive signal RFRX, other RF signals (not shown), or any combination thereof. In one embodiment of an RF communications slot, the RF communications slot is a time period during which RF transmissions, RF receptions, or both, may occur. Adjacent RF communications slots may be separated by slot boundaries, in which RF transmissions, RF receptions, or both, may be prohibited. As a result, during the slot boundaries, the RF communications system 10 may prepare for RF transmissions, RF receptions, or both.

In an exemplary aspect, the RF transmitter circuitry 12 is configured to provide the RF transmit signal RFTX having a wide modulation bandwidth, such as a 100 MHz or greater bandwidth. Because of this wide modulation bandwidth, a voltage error can occur in the envelope power supply signal EPS due to variable impedance sources, as discussed further below with respect to FIGS. 2 and 3. Accordingly, the ETIC 26 can include a frequency equalizer to compensate for these impedance sources, as discussed further below with respect to FIGS. 4-7. In some embodiments, the frequency equalizer is adaptive to compensate for changes in the variable impedance sources, as discussed further below with respect to FIGS. 8-11. Additional embodiments may enhance the adaptive frequency equalizer, as discussed further below with respect to FIGS. 12-14.

Figure 2:
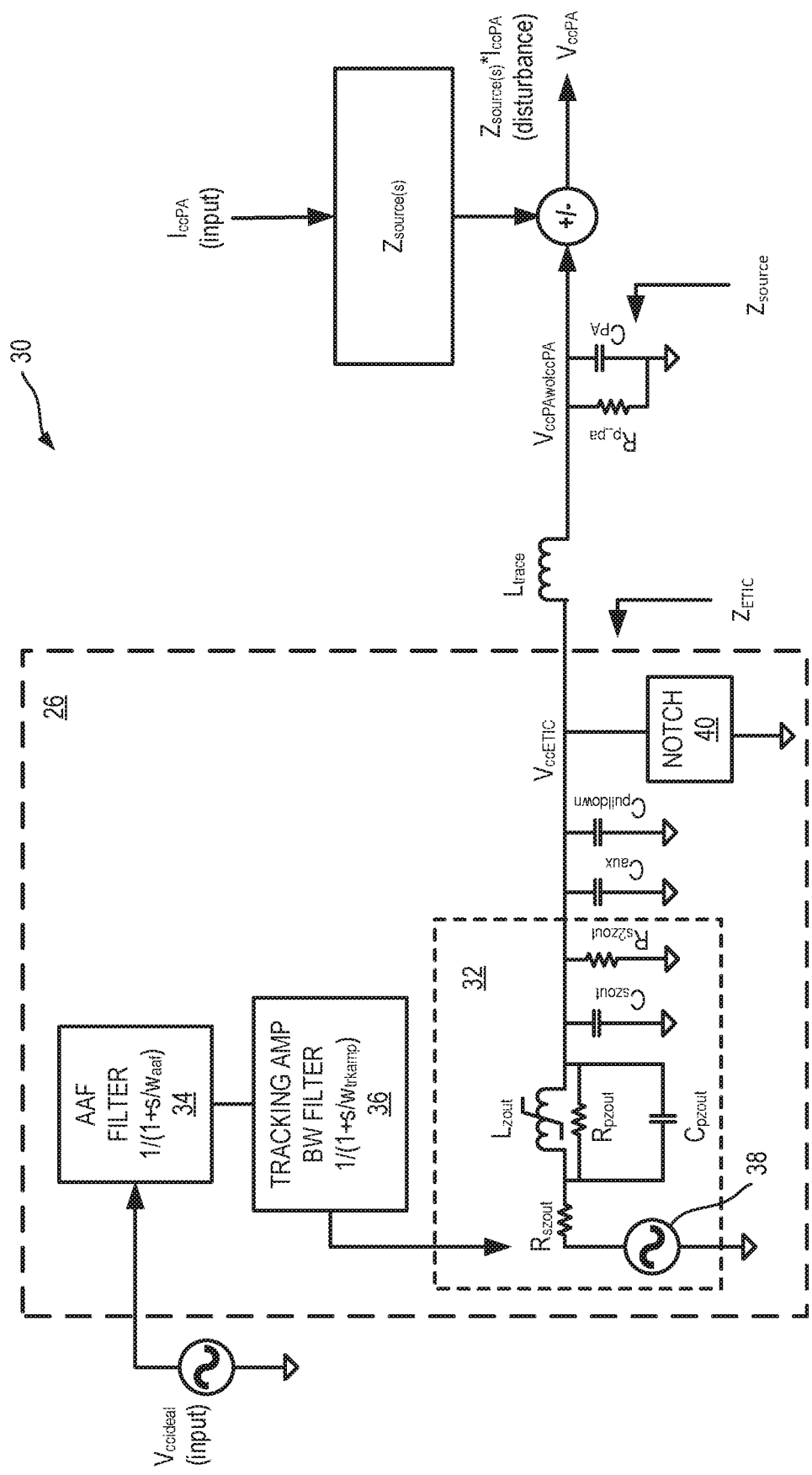
FIG. 2 is a schematic model of an exemplary envelope tracking (ET) system including an ET integrated circuit (ETIC) for the RF communications system of FIG. 1.

FIG. 2 is a schematic model of an exemplary ET system 30 including the ETIC 26 for the RF communications system 10 of FIG. 1. The ET system 30 is configured to couple to one or more PAs (e.g., the RF PA 24 of FIG. 1), and provides an envelope tracked power signal (e.g., power supply signal EPS of FIG. 1) having an ET modulated voltage $V_{ccPA}$ and a modulated PA load current $I_{ccPA}$ for the one or more PAs. The PA, in turn, amplifies an RF signal (e.g., RF amplifier input signal RFAI of FIG. 1) from an input power to an output power based on an ET modulated voltage $V_{ccETIC}$ generated by the ETIC 26.

In an exemplary aspect, the ET system 30 is modeled as a two input system which outputs the ET modulated voltage $V_{ccPA}$. The first input is a modulated target voltage signal $V_{ccideal}$ which is what drives the ETIC 26 (e.g., the envelope power supply control signal VRMP generated by the transmitter control circuitry 22 using the ET LUT). The second input is the modulated PA load current $I_{ccPA}$. The ET modulated voltage $V_{ccPA}$ is therefore a response of the ET system 30 relative to these inputs.

The modulated PA load current $I_{ccPA}$ creates a voltage error across the ET modulated voltage $V_{ccPA}$ based on the load modulation (modeled as an ETIC impedance $Z_{ETIC}$) and the source impedance $Z_{source}$ presented to the PA. The ETIC impedance $Z_{ETIC}$ includes various impedance sources. For example, the modulated target voltage signal $V_{ccideal}$ can control a tracking amplifier 32 after being filtered, such as with an anti-aliasing filter 34 (with transfer function $1/(1+s/w_{aaf})$) and/or a tracking amplifier bandwidth filter 36 (with transfer function $1/(1+s/w_{trkamp})$) The tracking amplifier 32 can be modeled as a current source 38 (dependent on the filtered modulated target voltage signal $V_{ccideal}$), a series resistance $R_{szout}$ between the current source 38 and a parallel inductance $L_{zout}$, parallel resistance $R_{pzout}$, and parallel capacitance $C_{pzout}$, a shunt capacitance $C_{szout}$, and a shunt resistance $R_{s2zout}$. The ETIC impedance $Z_{ETIC}$ can include additional impedance sources, such as a shunt auxiliary capacitance $C_{aux}$, a shunt pulldown capacitance $C_{pulldown}$, and a shunt notch filter 40.

The source impedance $Z_{source}$ includes various impedance sources, modeled as a series trace inductance $L_{trace}$ (e.g., inductance of a conductive trace between the ETIC 26 and the PA), a shunt resistance $R_{p\_pa}$ (which represents an incremental resistance around root mean square (RMS) ET modulated voltage over current, $V_{ccRMS}/I_{ccRMS}$), and a shunt capacitance $C_{PA}$. The modulated PA load current $I_{ccPA}$ is a function of the input power of the PA (i.e., $I_{ccPA}=f_2(P_{in})$). In addition, the modulated target voltage signal $V_{ccideal}$ is generated from the ET LUT (e.g., an isogain ET LUT, a low-slope ET LUT, or other appropriate ET LUT) using the envelope power supply control signal VRMP, which is a scaled digital input representing envelope input power $P_{in}$ (i.e., $V_{ccideal}=f_1(P_{in})$) Thus, the modulated PA load current $I_{ccPA}$ can be expressed as $I_{ccPA}=f_2(f_1^{-1}(V_{ccideal}))$ where $f_1^{-1}$ is the inverse of function $f_1$. This combined function leads to $I_{ccPA}=f(V_{ccideal})$. (in some examples, there may be multiple PAs, each of which has a corresponding source impedance $Z_{source}$).

Figure 3:
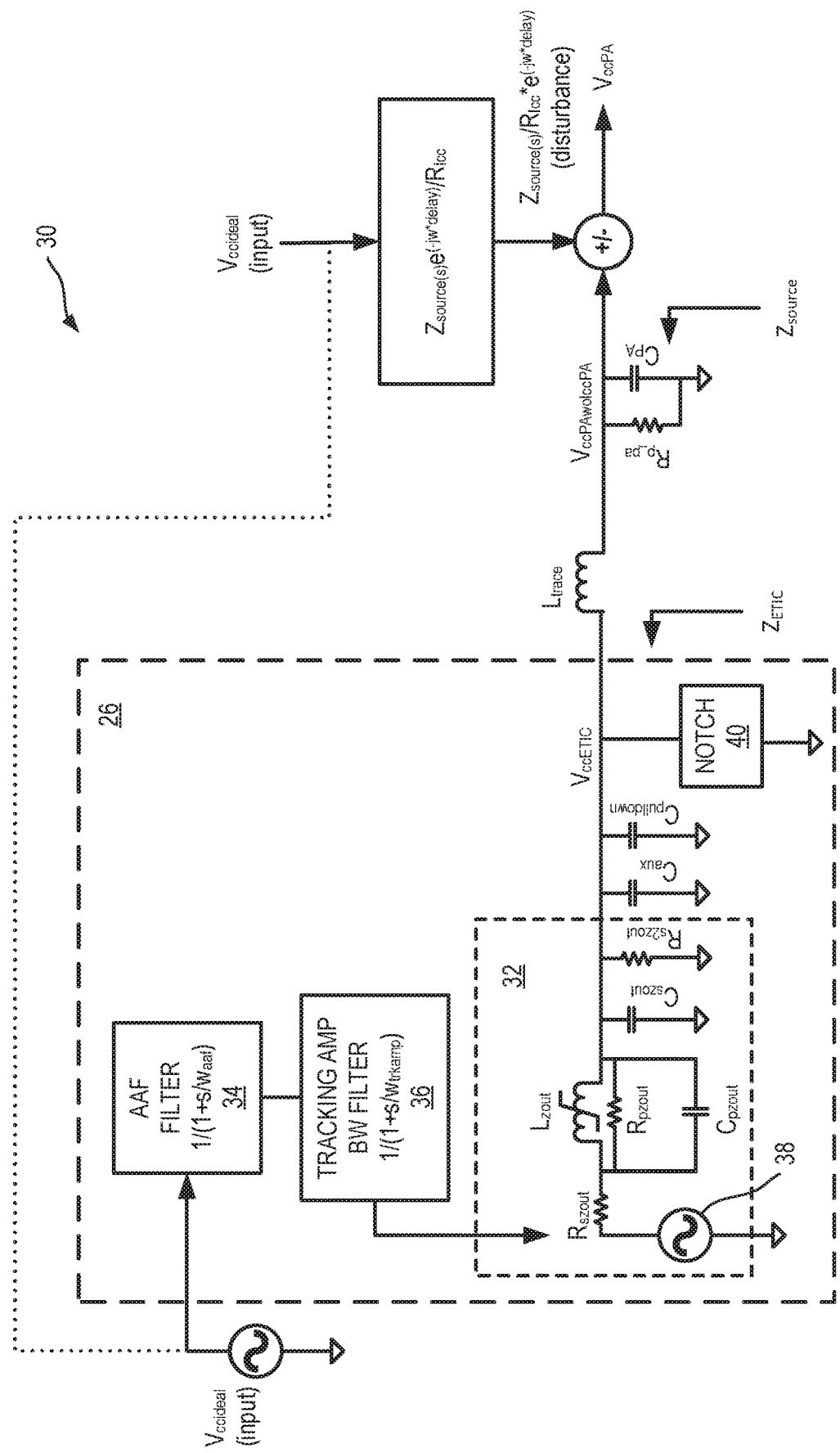
FIG. 3 is a schematic model of the ET system of FIG. 2, modeled as a single input system.

FIG. 3 is a schematic model of the ET system 30 of FIG. 2, modeled as a single input system. The modulated PA load current $I_{ccPA}=f(V_{ccideal})$ can generally be represented as a function of the modulated target voltage signal $V_{ccideal}$, DC voltage $V_0$, and PA resistance $R_{Icc}$ (representing a PA load-line equation) by $I_{ccPA}=(V_{ccideal}-V_0)/R_{Icc}$. Focusing on the non-DC components, the DC voltage $V_0$ can be removed such that the modulated PA load current $I_{ccPA}$ represents alternating current (AC) input current components and the modulated target voltage signal $V_{ccideal}$ represents AC input voltage components in the model of FIG. 2.

Under this approach, $I_{ccPA} \sim = V_{ccideal}(delay)/R_{Icc}$, where the delay represents a delay the modulated target voltage signal $V_{ccideal}$ will see within the signal path through the ET system 30. Thus the transfer function block diagram becomes a single input based system using only the modulated target voltage signal $V_{ccideal}$ as the input to the ET system 30. Because the PA resistance $R_{Icc}$ represents the PA load-line equation, it can change as a function of VSWR operation of the PA. The PA resistance $R_{Icc}$ can be estimated as discussed below with respect to FIGS. 8-11 and used to adjust settings of an adaptive frequency equalizer.

Figure 4:
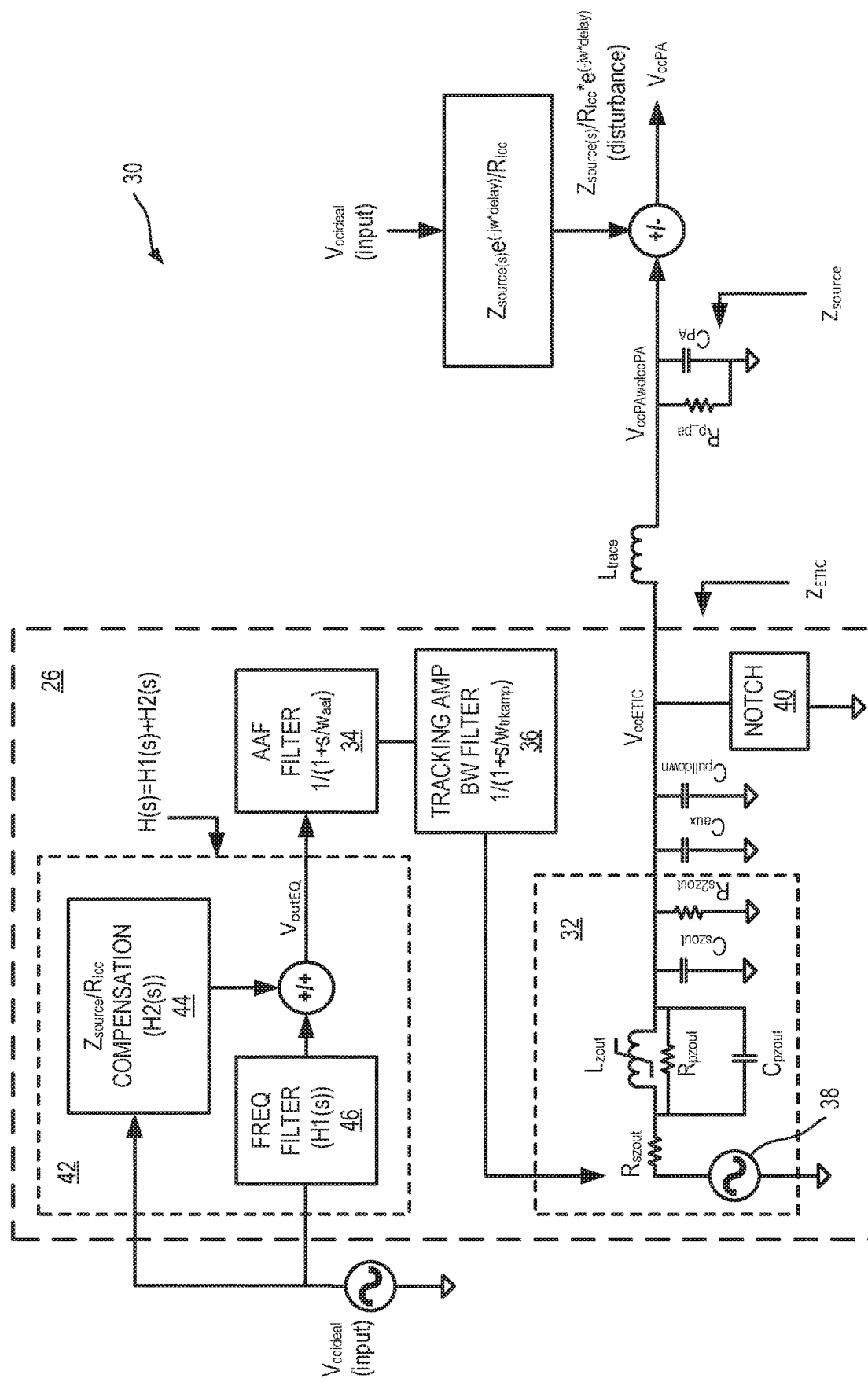
FIG. 4 is a schematic model of an exemplary embodiment of the ET system of FIG. 2 including a frequency equalizer for the ETIC.

FIG. 4 is a schematic model of an exemplary embodiment of the ET system 30 of FIG. 2 including a frequency equalizer 42 for the ETIC 26. The frequency equalizer 42 injects an error correcting signal into the ETIC 26 (e.g., as a function of the modulated target voltage signal $V_{ccideal}$) to compensate for a voltage tracking error in the ET modulated voltage $V_{ccPA}$ provided to the PA. In some examples, the frequency equalizer 42 is implemented as an analog circuit which uses a single block to create a transfer function H(s) to achieve this error compensation (e.g., to inject the error correcting signal into the ETIC 26).

In some examples, the frequency equalizer 42 is implemented as two blocks to create two transfer functions $H_1(s)$ and $H_2(s)$. A $Z_{source}/R_{Icc}$ compensation circuit 44 uses a second transfer function $H_2(s)$ to compensate for the $Z_{source}(s)/R_{Icc}$ effect (as a function of changes in the PA resistance $R_{Icc}$) and a frequency filter 46 uses a first transfer function $H_1(s)$ to equalize the remaining transfer function.

Figure 5:
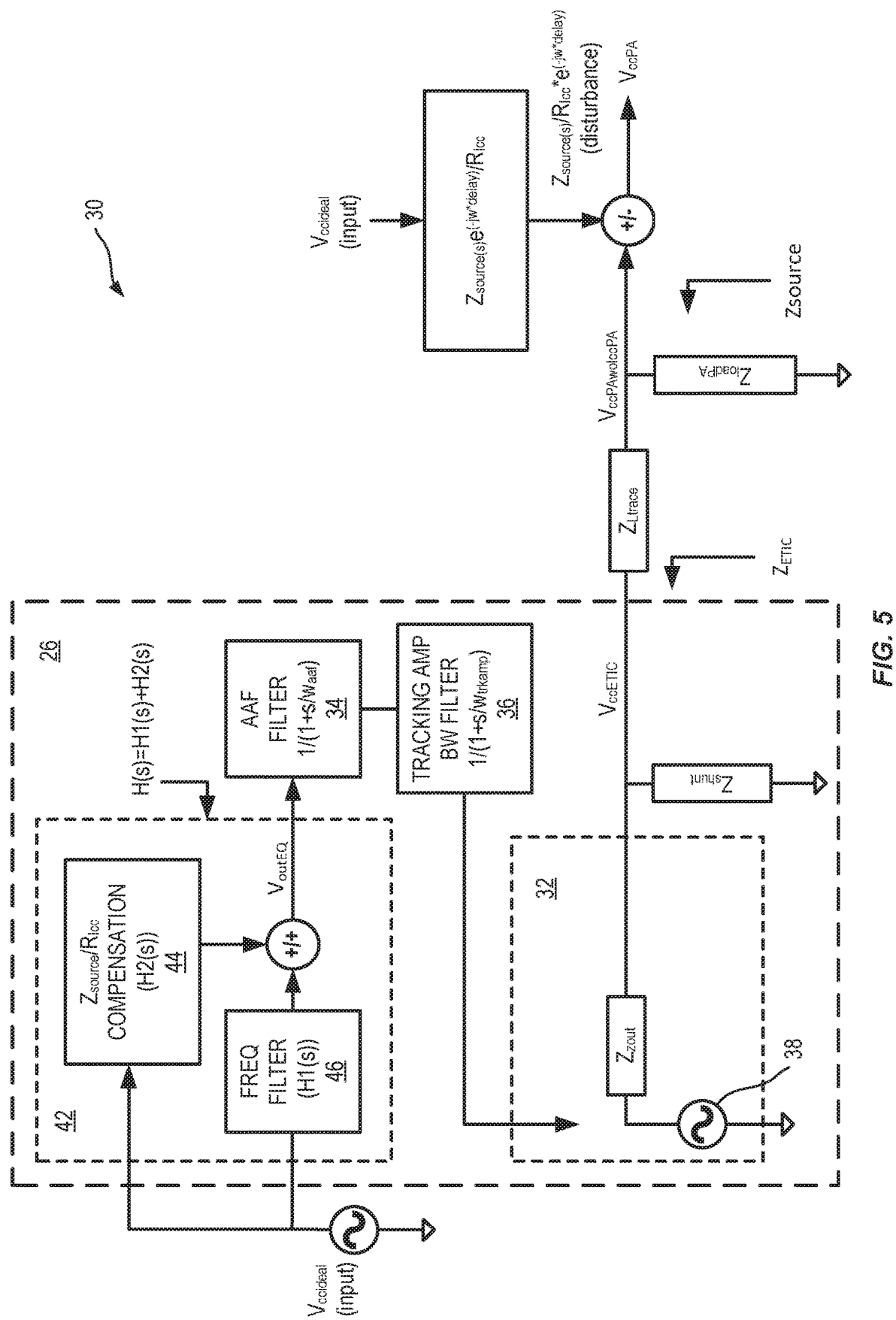
FIG. 5 is a schematic model of the ET system of FIG. 4 illustrated with combined impedances.

FIG. 5 is a schematic model of the ET system 30 of FIG. 4 illustrated with combined impedances. Mathematical calculations can be performed for the various transfer functions of the ET system 30, such as combining the effect of impedance sources in the ETIC impedance $Z_{ETIC}$. The series resistance $R_{szout}$ and the parallel inductance $L_{out}$, parallel resistance $R_{pzout}$, and parallel capacitance $C_{pzout}$ of the tracking amplifier 32 can be combined as a tracking amplifier output impedance $Z_{zout}$. The shunt capacitance $C_{szout}$ and shunt resistance $R_{s2zout}$ of the tracking amplifier 32 can be combined with the shunt auxiliary capacitance $C_{aux}$, the shunt pulldown capacitance $C_{pulldown}$, and the shunt notch filter 40 as a shunt impedance $Z_{shunt}$.

In addition, elements of the source impedance $Z_{source}$ can be combined. The series trace inductance $L_{trace}$ can be modeled as a trace impedance $Z_{ltrace}$. The shunt resistance $R_{p\_pa}$ and the shunt capacitance $C_{PA}$ can be combined as a PA load impedance $Z_{loadPA}$. Each of these combined impedances (the tracking amplifier output impedance $Z_{zout}$, the shunt impedance $Z_{shunt}$, the trace impedance $Z_{ltrace}$, and the PA load impedance $Z_{loadPA}$) can include real components and/or or equivalent models.

Figure 6:
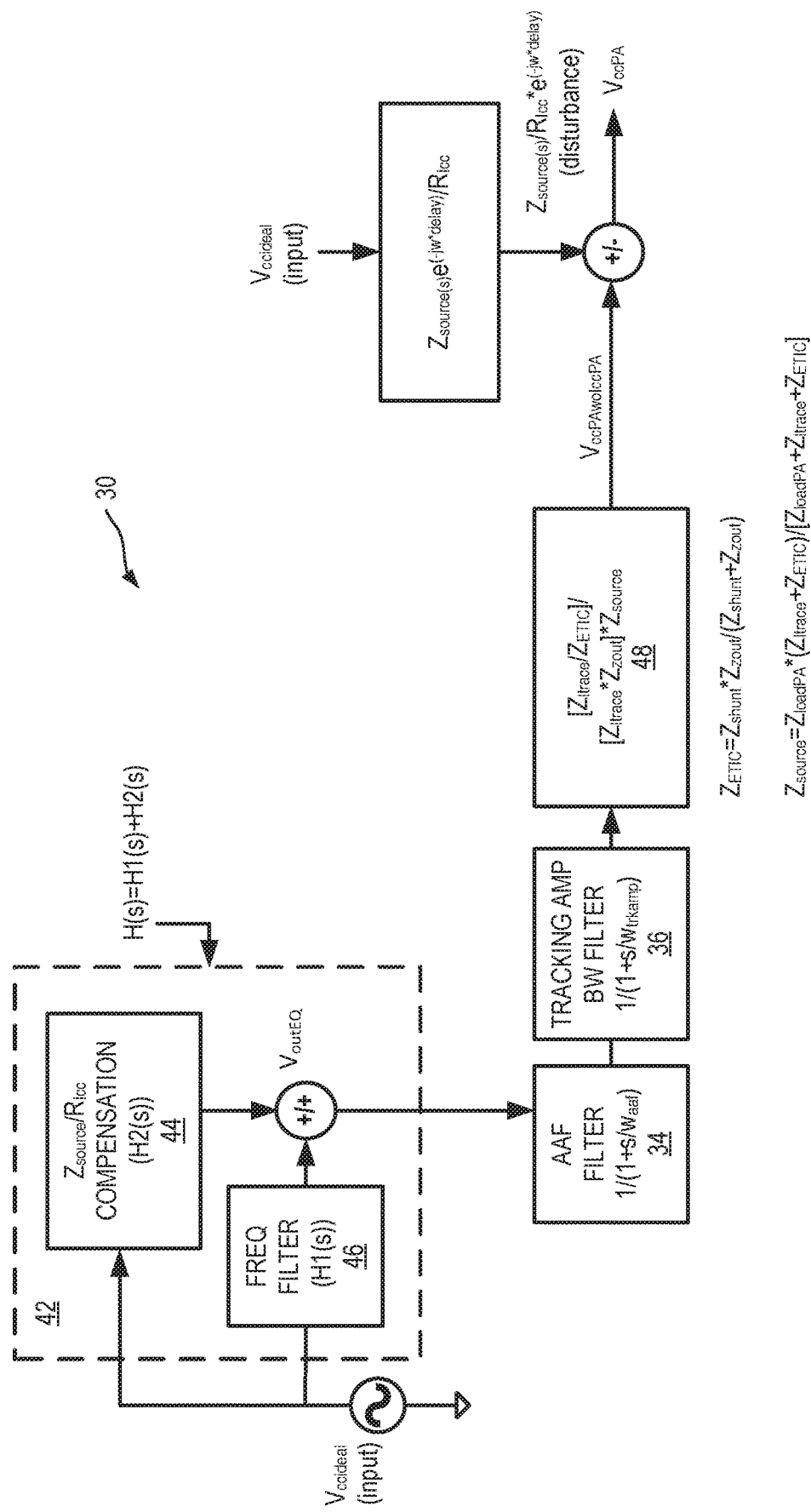
FIG. 6 is a schematic model of the overall transfer function of the ET system of FIG. 4.

FIG. 6 is a schematic model of the overall transfer function of the ET system 30 of FIG. 4. The network and transfer function can be calculated based on the illustrated model, where an overall network impedance 48 is derived from the tracking amplifier output impedance $Z_{zout}$, the shunt impedance $Z_{shunt}$, the trace impedance $Z_{ltrace}$, and the PA load impedance $Z_{loadPA}$:

$$\text{Network Impedance} = \frac{Z_{ltrace} / Z_{ETIC}}{Z_{ltrace} * Z_{zout}} Z_{source}$$

where the ETIC impedance $$Z_{ETIC} = \frac{Z_{shunt} * Z_{zout}}{Z_{shunt} + Z_{zout}}$$

and the source impedance $$Z_{source} = \frac{Z_{loadPA} * (Z_{ltrace} + Z_{ETIC})}{Z_{loadPA} + Z_{ltrace} + Z_{ETIC}}.$$

The overall transfer function for the ET system 30, expressed as $V_{ccPA}/V_{ccideal}$, is calculated as:

$$\frac{V_{ccPA}}{V_{ccideal}} = H(s) * AAF(s) * trkamp(s) * \frac{Z_{ltrace}/Z_{ETIC}}{Z_{ltrace} * Z_{zout}} Z_{source} - \frac{Z_{source}}{R_{Icc}} e^{-j\omega*delay}$$

$$\frac{V_{ccPA}}{V_{ccideal}} =$$

$$H_1(s) * AAF(s) * trkamp(s) * \frac{Z_{ltrace}/Z_{ETIC}}{Z_{ltrace} * Z_{zout}} Z_{source} - \frac{Z_{source}}{R_{Icc}} e^{-j\omega*delay} +$$

$$H_2(s) * AAF(s) * trkamp(s) * \frac{Z_{ltrace}/Z_{ETIC}}{Z_{ltrace} * Z_{zout}} Z_{source} - \frac{Z_{source}}{R_{Icc}} e^{-j\omega*delay}$$

where $$Z_{ETIC} = \frac{Z_{shunt} * Z_{zout}}{Z_{shunt} + Z_{zout}} \text{ and } Z_{source} = \frac{Z_{loadPA} * (Z_{ltrace} + Z_{ETIC})}{Z_{loadPA} + Z_{ltrace} + Z_{ETIC}}.$$

Figure 7:
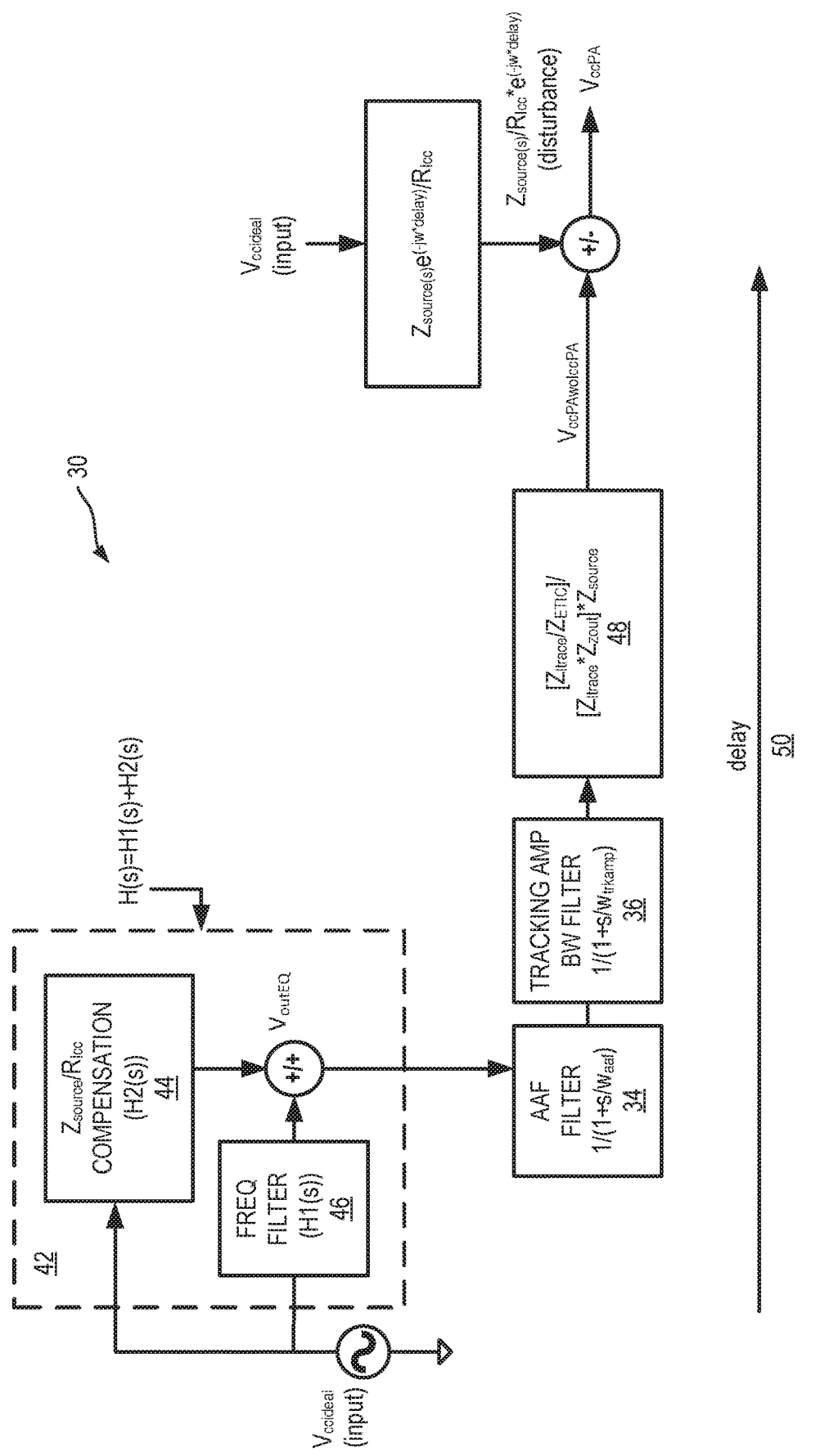
FIG. 7 is a schematic model of the ET system of FIG. 4 illustrating a delay in the overall transfer function.

FIG. 7 is a schematic model of the ET system 30 of FIG. 4 illustrating a delay 50 in the overall transfer function. The delay term in the transfer function is the delay 50 on the ET path from the modulated target voltage signal $V_{ccideal}$ to the ET modulated voltage $V_{ccPA}$ without a modulated PA load current $V_{ccPAwoIccPA}$, as shown in FIG. 7.

In one embodiment, the second transfer function $H_2(s)$ is set such that the $Z_{source}/R_{Icc}$ compensation circuit 44 cancels the effect of $Z_{source}(s)/R_{Icc}$:

$$H_2(s) * AAF(s) * trkamps(s) * \qquad \text{Equation 1}$$

$$\frac{Z_{ltrace}/Z_{ETIC}}{Z_{ltrace} * Z_{zout}} Z_{source} = \frac{Z_{source}}{R_{Icc}} e^{-j\omega*delay}$$

$$H_2(s) * AAF(s) * trkamp(s) * \frac{Z_{ltrace}/Z_{ETIC}}{Z_{ltrace} * Z_{zout}} = \frac{1}{R_{Icc}} e^{-j\omega*delay}$$

where the parameters of $H_2(s)$ are tuned via changes in the PA resistance $R_{Icc}$.

In addition, the first transfer function $H_1(s)$ is set to achieve an overall desired frequency response $H_{desired}$:

$$H_1(s) * AAF(s) * trkamp(s) * \frac{Z_{ltrace}/Z_{ETIC}}{Z_{ltrace} * Z_{zout}} Z_{source} = H_{desired} \qquad \text{Equation 2}$$

It should be noted that $H_1(s)$ is not a function of $R_{Icc}$ as a first approximation.

Figure 8:
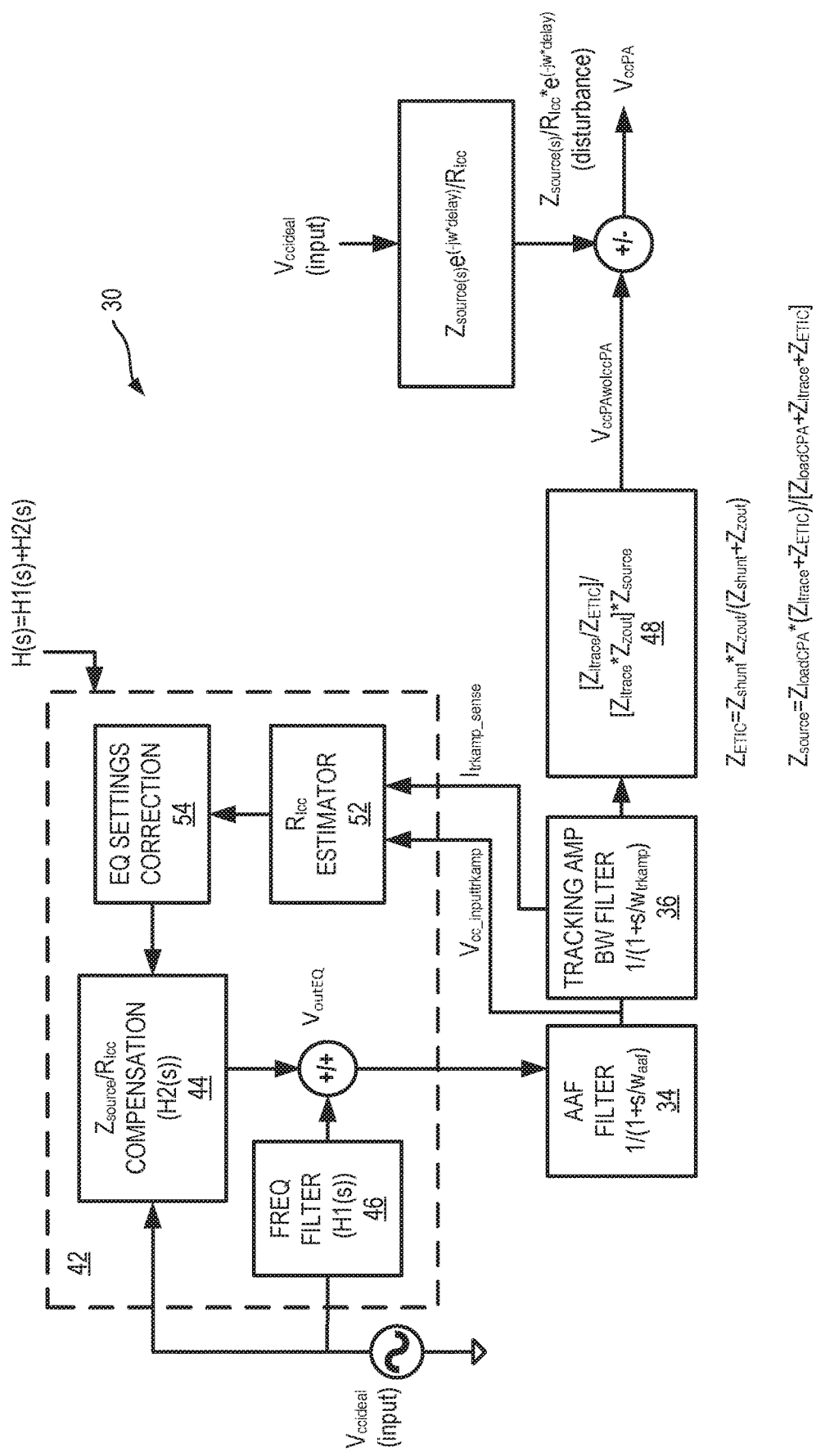
FIG. 8 is a schematic model of another exemplary embodiment of the ET system of FIGS. 2 and 4 with an adaptive frequency equalizer using a tracking amplifier sense current and a tracking amplifier input voltage to update settings of the adaptive frequency equalizer.

FIG. 8 is a schematic model of another exemplary embodiment of the ET system 30 of FIGS. 2 and 4 with an adaptive frequency equalizer 42 using a tracking amplifier sense current $I_{trkamp\_sense}$ and a tracking amplifier input voltage $V_{cc\_inputtrkamp}$ to update settings of the frequency equalizer 42. In an exemplary aspect, the frequency equalizer 42 includes a PA resistance estimator circuit 52 which estimates the PA resistance $R_{Icc}$ (representing the PA load-line equation) or its inverse $1/R_{Icc}$ from the tracking amplifier sense current $I_{trkamp\_sense}$ and the tracking amplifier input voltage $V_{cc\_inputtrkamp}$.

An equalizer settings correction circuit 54 maps the estimated PA resistance $R_{Icc}$ or its inverse $1/R_{Icc}$ to different values of settings for the frequency equalizer 42 that can primarily affect the $H_2(s)$ response of the $Z_{source}/R_{Icc}$ compensation circuit 44. The corrected settings for the frequency equalizer 42 eventually affects the $H_1(s)$ response of the frequency filter 46 to equalize the overall ET system 30 response $V_{ccPA}/V_{ccideal}$ under varying PA resistance $R_{Icc}$ conditions.

Figure 9:
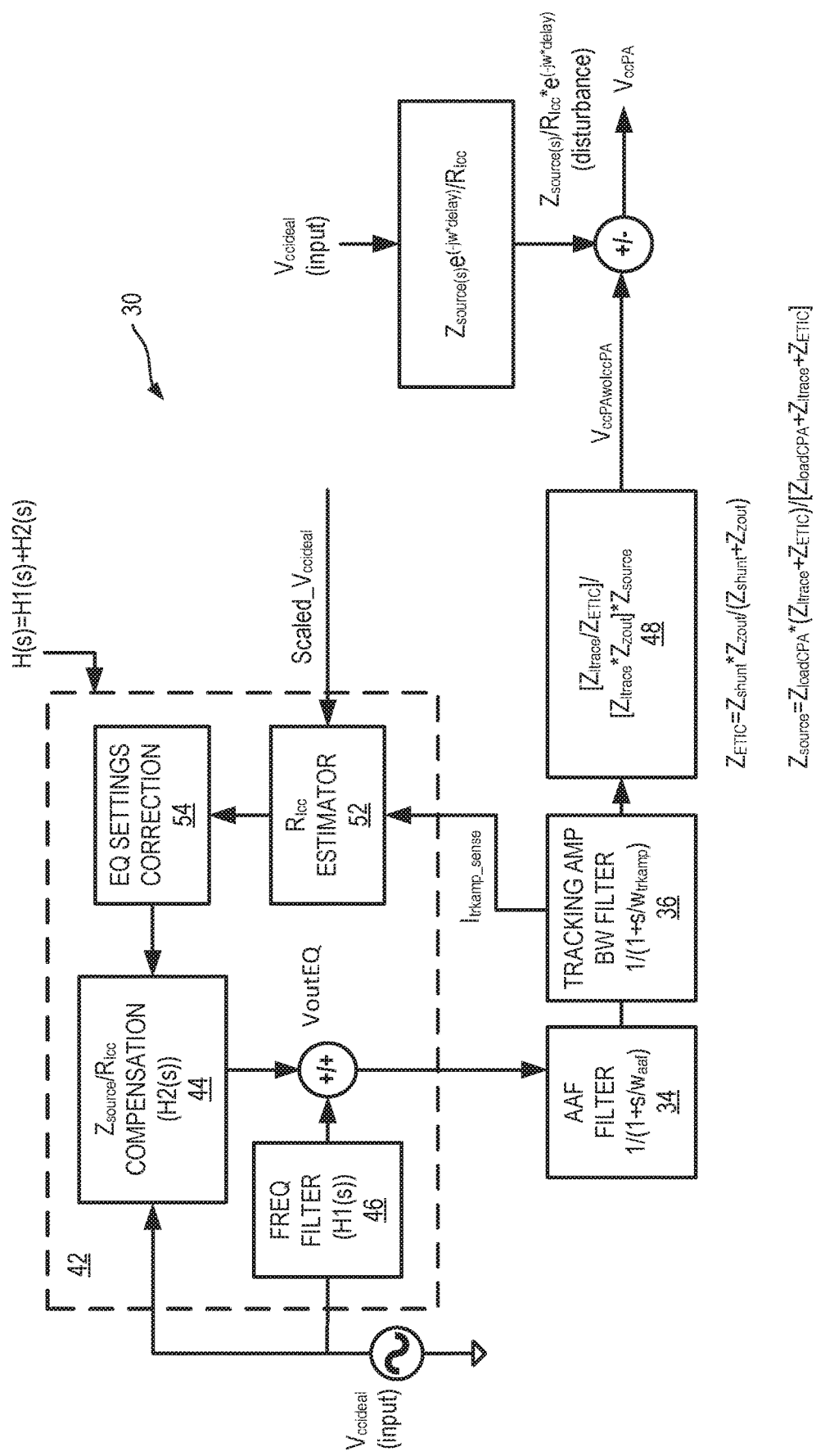
FIG. 9 is a schematic model of another exemplary embodiment of the ET system of FIGS. 2 and 4 with an adaptive frequency equalizer using the tracking amplifier sense current and a scaled ideal voltage to update settings of the adaptive frequency equalizer.

FIG. 9 is a schematic model of another exemplary embodiment of the ET system 30 of FIGS. 2 and 4 with an adaptive frequency equalizer 42 using the tracking amplifier sense current $I_{trkamp\_sense}$ and a scaled ideal voltage Scaled_$V_{ccideal}$ to update settings of the frequency equalizer 42. The PA resistance estimator circuit 52 uses the tracking amplifier sense current $I_{trkamp\_sense}$ and the scaled ideal voltage Scaled_$V_{ccideal}$ (e.g., derived from the modulated target voltage signal $V_{ccideal}$) to estimate the PA resistance $R_{Icc}$ or any function of the PA resistance $R_{Icc}$ (e.g., $1/R_{Icc}$) that the PA has. This results in a highly accurate estimation of the PA resistance $R_{Icc}$ for very wide modulation bandwidth ET signals because most of the PA load current $I_{ccPA}$ is provided by the tracking amplifier bandwidth filter 36.

Figure 10:
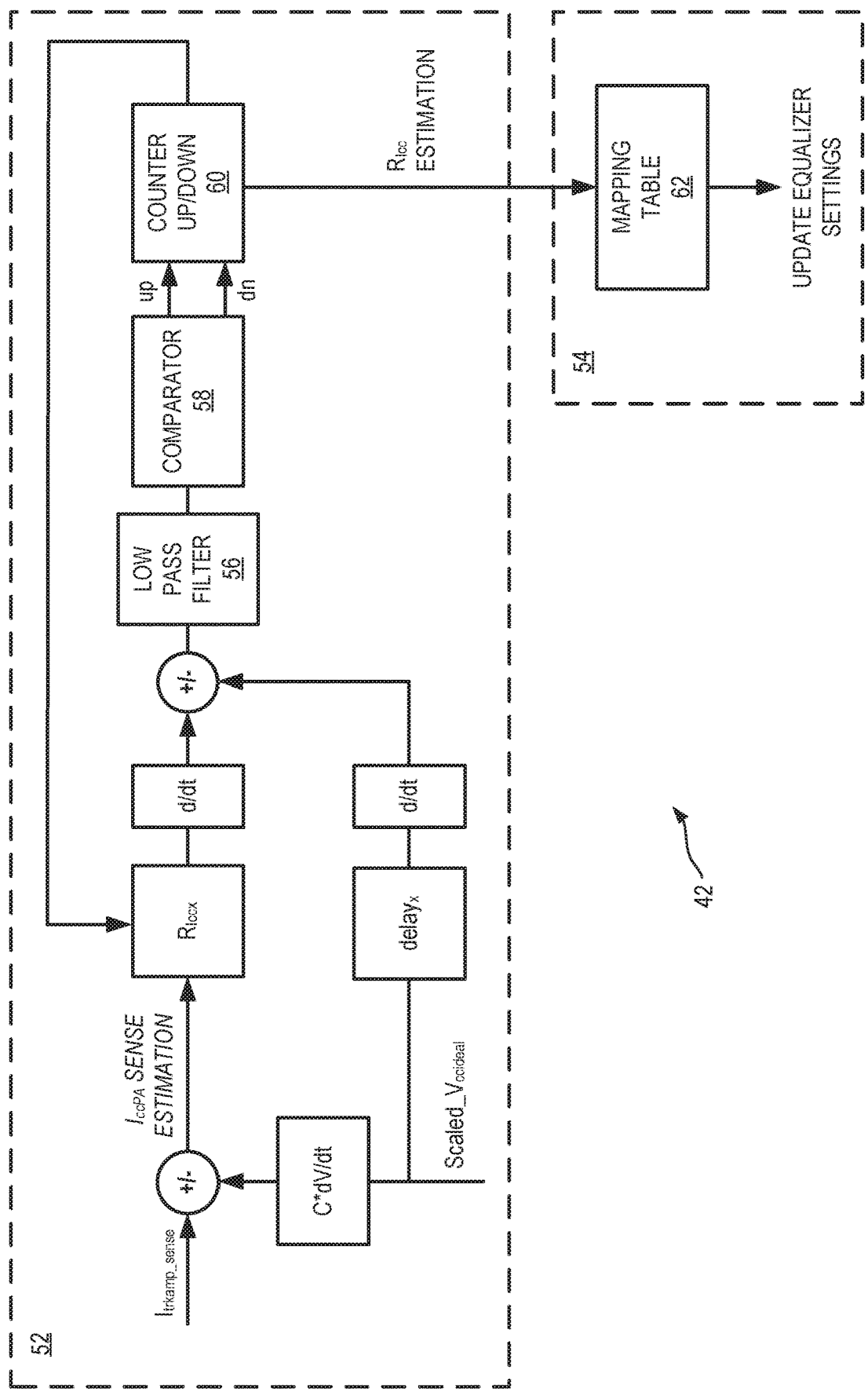
FIG. 10 is a schematic model of an exemplary embodiment of a PA resistance estimator circuit and an equalizer settings correction circuit for the adaptive frequency equalizer of FIG. 9.

FIG. 10 is a schematic model of an exemplary embodiment of the PA resistance estimator circuit 52 and the equalizer settings correction circuit 54 for the adaptive frequency equalizer 42 of FIG. 9. The PA resistance estimator circuit 52 can first estimate the AC component of the PA load current $I_{ccPA}$ by removing an estimated current due to capacitance to a ground reference $C^*dV/dt$. The estimated PA load current $I_{ccPA}$ is then converted into a voltage by multiplying by a programmable resistor $R_{Iccx}$. The slope of the scaled ideal voltage Scaled_$V_{ccideal}$ (with an estimated delay $delay_x$) is subtracted from the slope of $R_{Iccx}*I_{ccPA}$, filtered through a low pass filter 56, and compared with a comparator 58. The value of the programmable resistor $R_{Iccx}$ is adjusted (e.g., digitally incremented or decremented) with an up/down counter 60 until the slopes match.

The value of the programmable resistor $R_{Iccx}$ which results in this match is the estimated PA resistance $R_{Icc}$ and is passed to the equalizer settings correction circuit 54, which can use a digital mapping table 62 (e.g., an LUT implemented in an ASIC or other logic circuit) to provide different settings for the frequency equalizer 42. It should be understood that this embodiment is illustrative in nature, and other approaches can be used to estimate the slope between the estimated PA load current $I_{ccPA}$ and the scaled ideal voltage Scaled_$V_{ccideal}$. Accordingly, other embodiments may implement the PA resistance estimator circuit 52 and the equalizer settings correction circuit 54 differently. In some examples, the functions of the of the PA resistance estimator circuit 52 and the equalizer settings correction circuit 54 can be combined in a single circuit or divided into additional sub-circuits.

Figure 11:
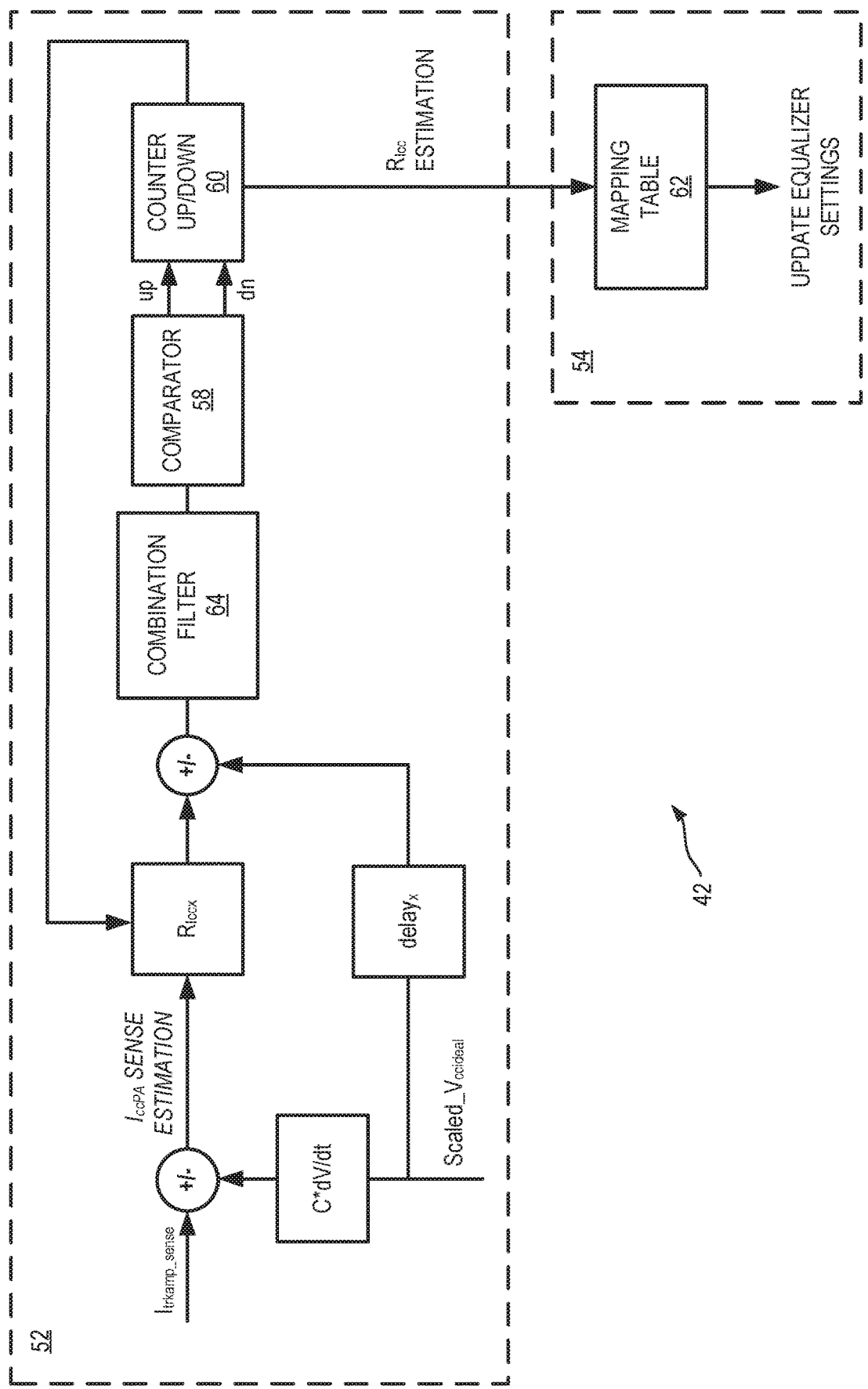
FIG. 11 is a schematic model of another exemplary embodiment of the PA resistance estimator circuit and the equalizer settings correction circuit for the adaptive frequency equalizer of FIG. 9.

FIG. 11 is a schematic model of another exemplary embodiment of the PA resistance estimator circuit 52 and the equalizer settings correction circuit 54 for the adaptive frequency equalizer 42 of FIG. 9. In this example, the derivative and low-pass filter 56 of FIG. 10 are replaced by a single combination filter 64 that combines both functions. In other examples, additional functions of the PA resistance estimator circuit 52 can be combined into a single operational amplifier and with appropriate resistors and capacitors for biasing.

In this manner, the adaptive frequency equalizer 42 described with respect to FIGS. 8-11 can use internal information in the ETIC 26 to detect changes in the PA resistance $R_{Icc}$ at the PA. The adaptive frequency equalizer 42 can further use this information to update its transfer function(s) to compensate for these changes relative to a nominal PA resistance $R_{Iccnom}$ value.

Returning to FIG. 9, the transfer functions $H_1(s)$ and $H_2(s)$ and/or the single transfer function $H(s)$ of the frequency equalizer 42 can be defined in a number of ways to be adaptive relative to the PA resistance $R_{Icc}$ and improve ET performance of the ET system 30. Several exemplary cases are described below, along with the parameters of the frequency equalizer 42 which can be adjusted using the PA resistance estimator circuit 52 and the equalizer settings correction circuit 54.

Case 1) Predefined Complex poles frequency equalizer for $H(s)$: The frequency equalizer 42 includes a single predefined equalizer that is based on 2nd order complex poles, defined by:

$$H(s) = \frac{1}{1 + \frac{s}{Q_{eq} * \omega_{0eq}} - \left(\frac{s}{\omega_{0eq}}\right)^2}$$

where $Q_{eq}$ is the quality (Q) factor and $\omega_{0eq}$ is the natural pulsation frequency of the frequency equalizer 42. It should be understood that this transfer function can also be decomposed into two equivalent terms $H_1(s)+H_2(s)=H(s)$ where $H_2(s)$ is set to a transfer function having a zero only transfer function with a scaling factor $a_x R_{Icc}$ and $H_1(s)=H(s)-H_2(s)$.

In this case, the overall ET system 30 response $V_{ccPA}/V_{ccideal}$ can be equalized by tuning the Q factor $Q_{eq}$ of the frequency equalizer 42 as a function of changes in the PA resistance $R_{Icc}$. For example, the Q factor $Q_{eq}$ can be defined as a function of a new PA resistance $R_{Icc}^*$ as follows:

$$Q_{eq}(R_{Icc}^*) = Q_{eqnom} * \sqrt{\frac{R_{Iccnom}}{R_{Icc}^*}}$$

where $Q_{eqnom}$ is a nominal Q factor and $R_{Iccnom}$ is a nominal PA resistance of the transfer function $H(s)$ of the frequency equalizer 42.

Case 2) Frequency equalizer using independent $H_1$ and $H_2$ equalizer: The frequency equalizer 42 includes two transfer functions $H_1$ and $H_2$ (e.g., for the $Z_{source}/R_{Icc}$ compensation circuit 44 and the frequency filter 46, respectively) which are predefined independently resulting in an overall transfer function $H(s)$ predefined equalizer response.

The second transfer function $H_2(s)$ is based on a zero-transfer function with a scaling term $a_x R_{Icc}$ that is scaled relative to $1/R_{Icc}$ changes, where the scaling term $a_x R_{Icc}$ is proportional to the nominal PA resistance over the new PA resistance $$\frac{R_{Iccnom}}{R_{Icc}^*}.$$

$$H_2(s) = a_x R_{Icc}\left(1 + \frac{s}{\omega_{zero}}\right)$$

where $\omega_{zero}$ is a zero frequency of the transfer function.

The first transfer function $H_1(s)$ is based on a second order complex zero transfer function and a real pole:

$$H_1(s) = \left(1 + \frac{s}{Q_{eq} * \omega_{0eq}}\right) - \frac{\left(\frac{s}{\omega_{0eq}}\right)^2}{1 + \frac{s}{\omega_{0eq}}}$$

In this case, the overall ET system 30 response $V_{ccPA}/V_{ccideal}$ can be equalized by scaling the coefficient term of the second transfer function $H_2(s)$. By adjusting the scaling term $a_x R_{Icc}$ relative to changes in the PA resistance $R_{Icc}$, while keeping the first transfer function $H_1(s)$ unchanged, the overall frequency versus PA load-line is tuned for wide modulation bandwidth signals as follows:

$$a_x R_{Icc}(R^*_{Icc}) = a_x R_{Iccnom} \frac{R_{Iccnom}}{R^*_{Icc}}$$

Case 3) Frequency equalizer using real pole/real zero H(s) predefined equalizer: In this case, a predefined equalizer H(s) has a real pole and a real zero (from which $H_1(s)$ and $H_2(s)$ can be derived mathematically from H(s)). The transfer function H(s) is defined as:

$$H(s) = \frac{1 + \frac{s}{\omega_{eqzero}}}{1 + \frac{s}{\omega_{eqpole}}}$$

where $\omega_{eqzero}$ is a zero frequency of the frequency equalizer 42 and $\omega_{eqpole}$ is a pole frequency of the frequency equalizer 42.

In this case, the overall ET system 30 response $V_{ccPA}/V_{ccideal}$ can be equalized to compensate for PA load-line variation by scaling the frequency of the frequency equalizer 42 zero $\omega_{eqzero}$ and scaling the frequency of the frequency equalizer 42 pole $\omega_{eqpole}$ as a function of changes in the PA resistance $R_{Icc}$ as follows:

$$\omega_{eqzero}(R^*_{Icc}) = \omega_{eqzeronom} \frac{R^*_{Icc}}{R_{Iccnom}}$$

$$\omega_{eqpole}(R^*_{Icc}) = \omega_{eqpolenom} \frac{R^*_{Icc}}{R_{Iccnom}}$$

where $\omega_{eqzeronom}$ is a nominal zero frequency of the frequency equalizer 42 and $\omega_{eqpolenom}$ is a nominal pole frequency of the frequency equalizer 42.

In summary, various analog frequency equalizers can be used in embodiments of the adaptive frequency equalizer 42. In some embodiments, only one or two parameters need to be tuned relative to changes in the PA resistance $R_{Icc}$ versus the nominal value, resulting in simple and effective adaptive tuning for very wide modulation bandwidth ET.

Figure 12:
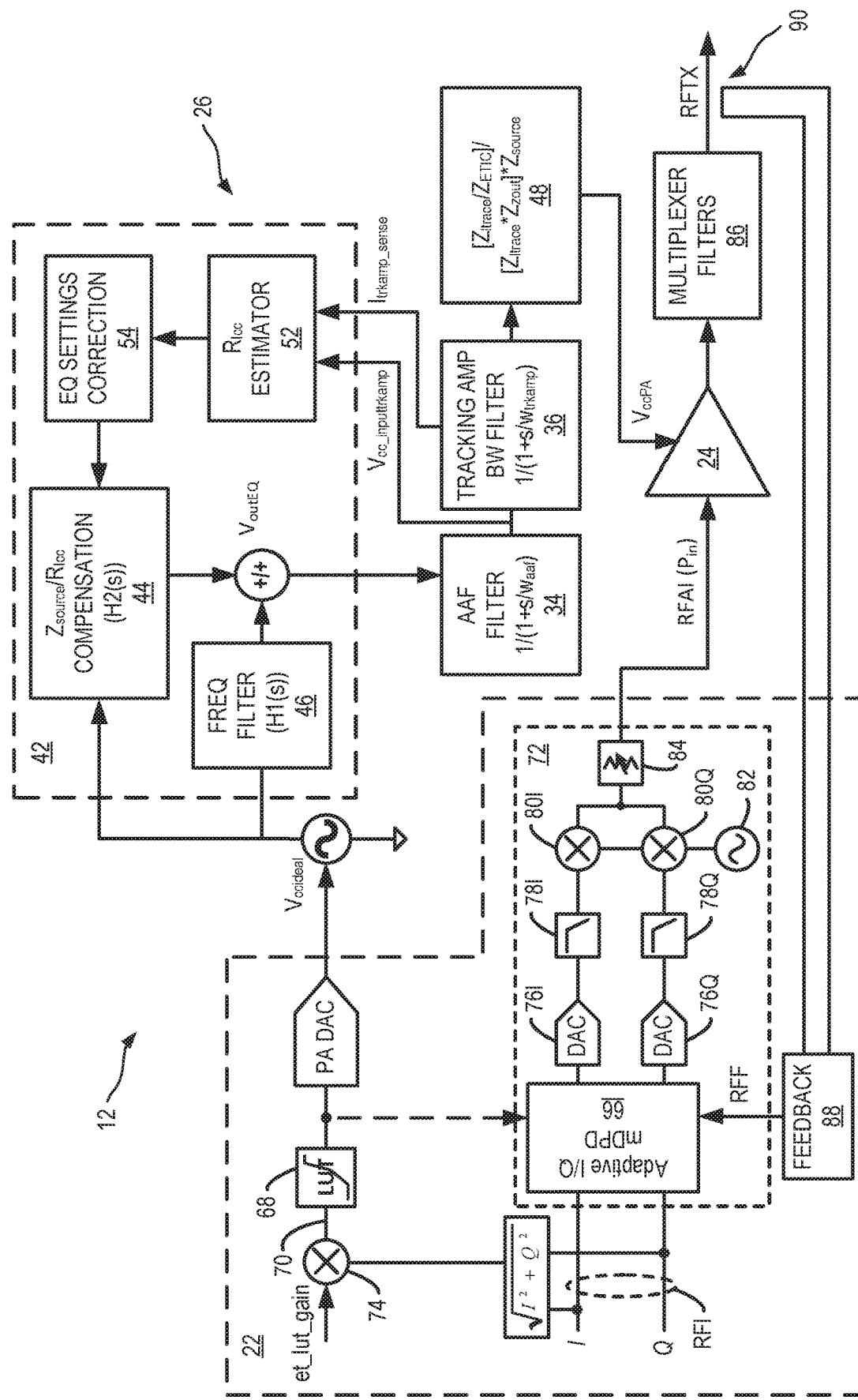
FIG. 12 is a block schematic diagram of an embodiment of the RF transmitter circuitry of FIG. 1 with the ETIC having the adaptive frequency equalizer and the transmitter control circuitry having an adaptive in-phase/quadrature (I/Q) memory digital pre-distortion (mDPD) circuit.

FIG. 12 is a block schematic diagram of an embodiment of the RF transmitter circuitry 12 of FIG. 1 with the ETIC 26 having the adaptive frequency equalizer 42 and the transmitter control circuitry 22 having an adaptive in-phase/quadrature (I/Q) memory digital pre-distortion (mDPD) circuit 66. The modulated target voltage signal $V_{ccideal}$ is provided by the transmitter control circuitry 22 based on an ET LUT gain signal et_lut_gain (e.g., received as part of, or derived from, the transmitter configuration signal TXCS of FIG. 1) and the RF input signal RFI. In this regard, the transmitter control circuitry 22 includes a target voltage LUT 68, which in some examples is an ASIC and includes storage elements (e.g., registers) for storing predetermined digital target voltages in association with received digital amplitudes 70. The target voltage LUT 68 may also include processing elements (e.g., microprocessors) to generate a digital target voltage based on the digital amplitudes 70.

The transmitter control circuitry 22 further includes a signal processing circuit 72 configured to generate the RF amplifier input signal RFAI based on the RF input signal RFI, which is a digital signal. In a non-limiting example, the RF input signal RFI, which can be a digital baseband signal, includes a digital in-phase (I) signal and a digital quadrature (Q) signal, corresponding to an in-phase amplitude I and a quadrature amplitude Q, respectively. The in-phase amplitude I and the quadrature amplitude Q collectively define a number of digital amplitudes $\sqrt{I^2 + Q^2}$. The transmitter control circuitry 22 may include a combiner 74, which combines the digital amplitudes $\sqrt{I^2 + Q^2}$ with the ET LUT gain signal et_lut_gain (e.g., received as part of, or derived from the transmitter configuration signal TXCS of FIG. 1) to generate the digital amplitudes 70.

The signal processing circuit 72 further includes the adaptive I/Q mDPD circuit 66, which is configured to perform mDPD on the I/Q components of the RF input signal RFI. The signal processing circuit 72 includes an in-phase digital-to-analog converter (DAC) 76I and a quadrature DAC 76Q that convert the digital in-phase signal and the digital quadrature signal into an analog in-phase signal and an analog quadrature signal, respectively. The signal processing circuit 72 may include an in-phase filter 78I and a quadrature filter 78Q for passing the analog in-phase signal and the analog quadrature signal in a desired frequency band, respectively. The signal processing circuit 72 may include an in-phase multiplexer 80I and a quadrature mixture 80Q configured to convert the analog in-phase signal and the analog quadrature signal to appropriate frequencies (e.g., carrier frequency or intermediate frequency). The in-phase multiplexer 80I and the quadrature mixture 80Q may be configured to operate based on a reference frequency provided by an oscillator 82. The signal processing circuit 72 includes a signal combiner 84 configured to combine the analog in-phase signal and the analog quadrature signal to generate the RF amplifier input signal RFAI.

The transmitter circuitry 12 includes the ETIC 26, which uses the adaptive frequency equalizer 42 to compensate for the effect of load-line variations (e.g., PA resistance $R_{Icc}$) on the ET modulated voltage $V_{ccPA}$ provided to the RF PA 24. In an exemplary aspect, the adaptive I/Q mDPD circuit 66 may further enhance performance of the transmitter circuitry 12 by compensating for I/Q errors created by the RF PA 24 and/or multiplexer filters 86 in the transmission path. The adaptive I/Q mDPD circuit 66 can receive an RF feedback signal RFF through a feedback circuit 88, which is coupled to the RF transmit signal RFTX through one or more bidirectional couplers 90. Using the RF feedback signal RFF, the adaptive I/Q mDPD circuit 66 works in conjunction with the adaptive frequency equalizer 42 to correct ET errors in the ET modulated voltage $V_{ccPA}$.

Figure 13:
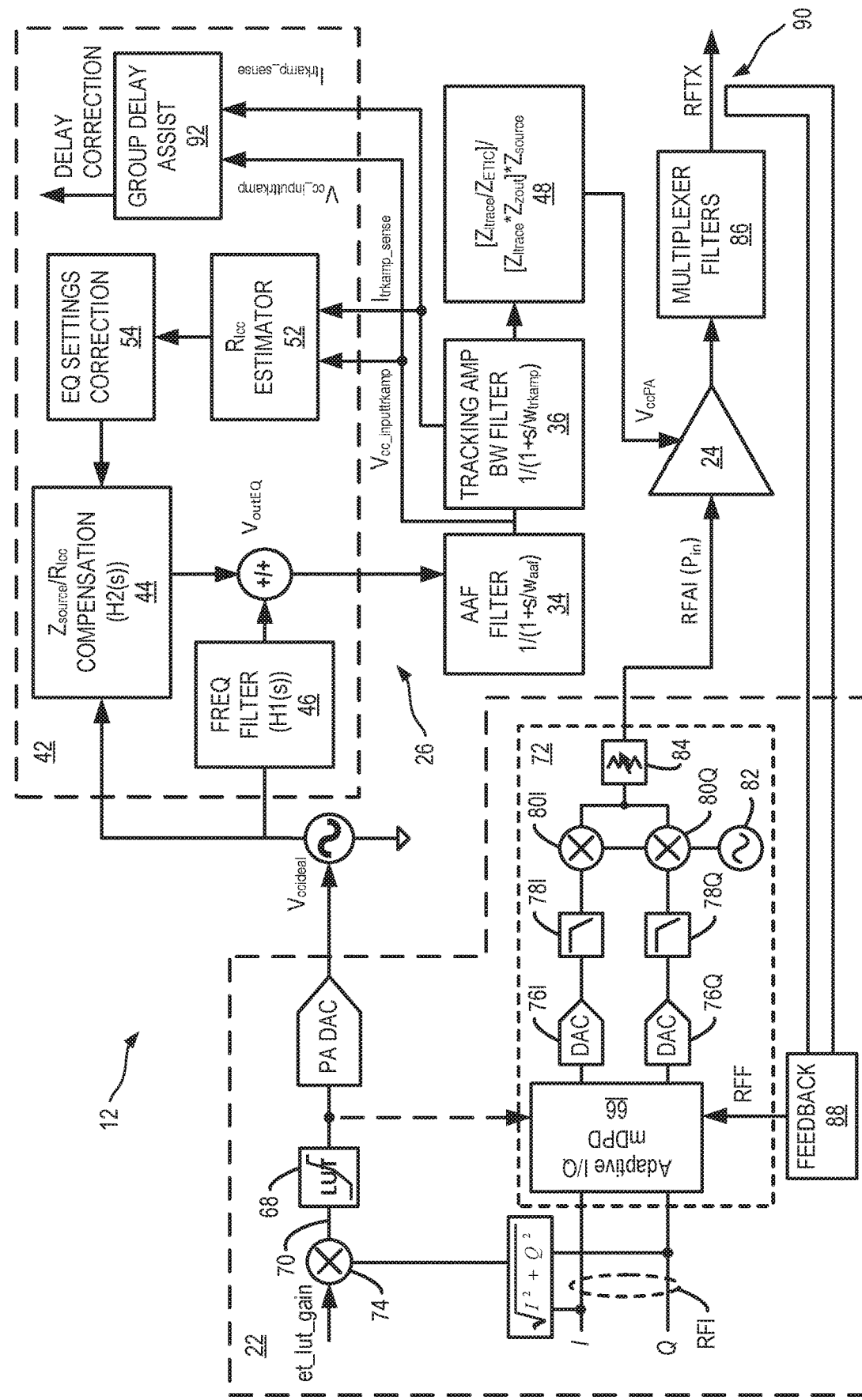
FIG. 13 is a block schematic diagram of another embodiment of the RF transmitter circuitry of FIG. 12 with a group delay assist circuit.

FIG. 13 is a block schematic diagram of another embodiment of the RF transmitter circuitry 12 of FIG. 12 with a group delay assist circuit 92. In this example, in addition to the PA resistance estimator circuit 52, the adaptive frequency equalizer 42 includes the group delay assist circuit 92, which uses the tracking amplifier sense current $I_{trkamp\_sense}$ and the tracking amplifier input voltage $V_{cc\_inputtrkamp}$ to estimate a group delay between and provide a mismatch correction between the ET modulated voltage $V_{ccPA}$ and the modulated PA load current $I_{ccPA}$.

Figure 14:
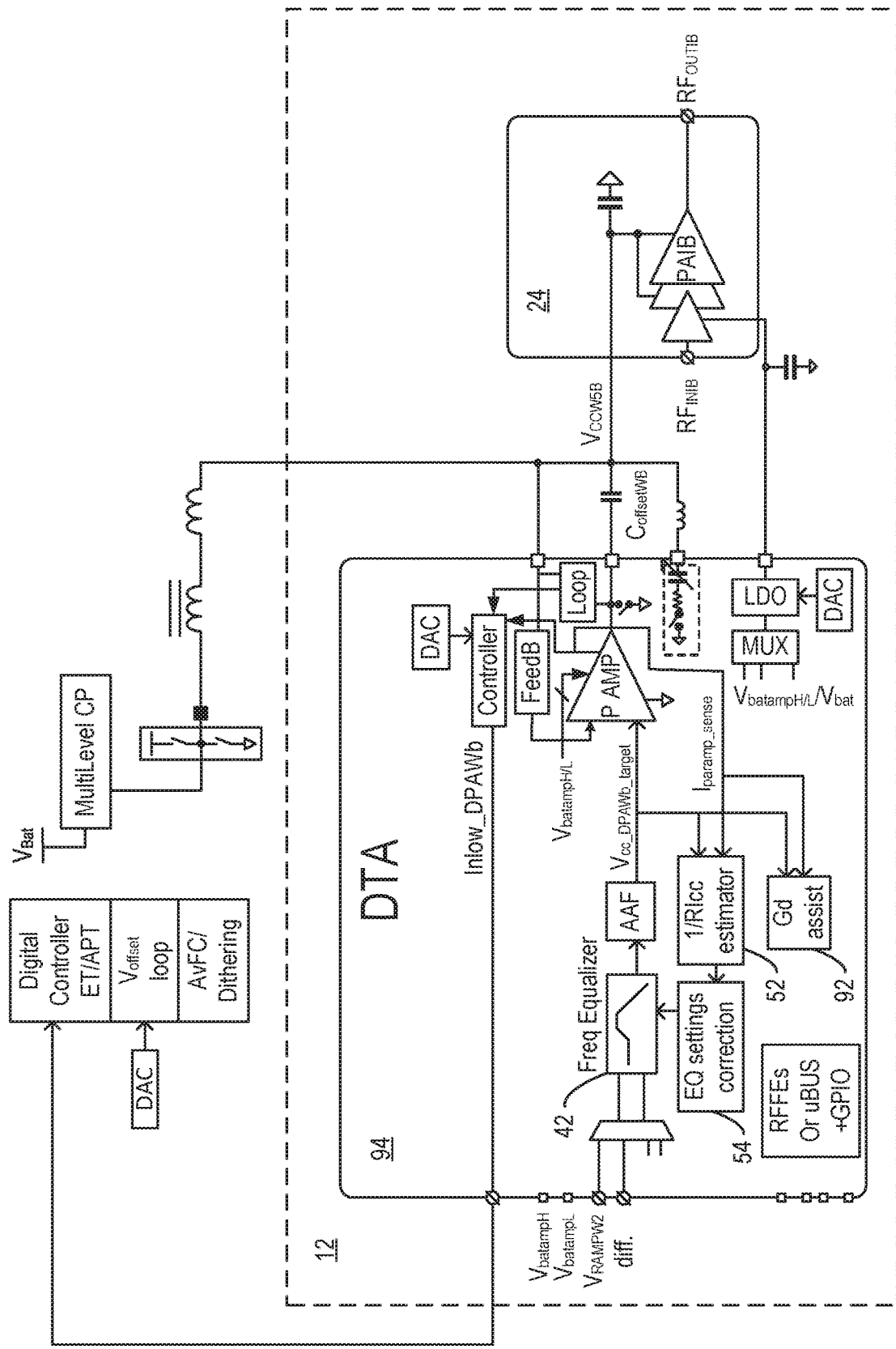
FIG. 14 is a block schematic diagram of the adaptive frequency equalizer integrated into a displaced tracking amplifier (DTA).

It should be understood that the embodiments described and depicted herein are illustrative in nature, and improvements and modifications are considered within the scope of the concepts disclosed herein. For example, FIG. 14 is a block schematic diagram of the adaptive frequency equalizer 42 integrated into a displaced tracking amplifier (DTA) 94. In this example, the adaptive frequency equalizer 42 in the DTA 94 can track variations versus VSWR in addition to the group delay assist circuit 92.

What is claimed is:

1. A radio frequency (RF) circuit, comprising:
   a power supply;
   an envelope tracking integrated circuit (ETIC) coupled to the power supply and configured to provide an envelope tracked power signal to a power amplifier (PA); and
   an adaptive frequency equalizer configured to inject an error correcting signal into the ETIC, the error correcting signal compensating for a voltage tracking error in the envelope tracked power signal due to a variable load impedance at the PA and a variable trace inductance between the ETIC and the PA;
   wherein the adaptive frequency equalizer comprises an impedance compensation circuit and a frequency filter which inject the error correcting signal as a function of a modulated target voltage signal which controls an envelope tracking (ET) function of the ETIC.

2. The RF circuit of claim 1, wherein:
   the adaptive frequency equalizer further comprises a PA resistance estimator circuit configured to estimate a combined impedance effect of the variable load impedance at the PA and the variable trace inductance; and
   the error correcting signal is adjusted based on an output of the PA resistance estimator circuit.

3. The RF circuit of claim 2, wherein the PA resistance estimator circuit estimates the combined impedance based on a current through the ETIC and a voltage representative of the envelope tracked power signal at the PA.

4. The RF circuit of claim 3, wherein the PA resistance estimator circuit is coupled to an input voltage of a tracking amplifier in the ETIC.

5. The RF circuit of claim 3, wherein the PA resistance estimator circuit is coupled to a scaled ideal voltage derived from the modulated target voltage signal.

6. The RF circuit of claim 2, wherein the adaptive frequency equalizer further comprises an equalizer settings correction circuit coupled to the PA resistance estimator circuit and is configured to update settings of a transfer function of the impedance compensation circuit based on the output of the PA resistance estimator circuit.

7. The RF circuit of claim 1, further comprising transmitter control circuitry configured to provide the modulated target voltage signal;
   wherein:
      the ETIC provides the envelope tracked power signal as a function of the modulated target voltage signal; and
      the adaptive frequency equalizer is coupled to the modulated target voltage signal and defines a transfer function to compensate for the voltage tracking error in the envelope tracked power signal.

8. The RF circuit of claim 7, wherein the transfer function is a function of changes in a PA resistance and a delay in the modulated target voltage signal through the ETIC.

9. The RF circuit of claim 7, further comprising a signal processing circuit configured to generate an RF amplifier input signal to be amplified by the PA using the envelope tracked power signal;
   wherein the signal processing circuit comprises an adaptive in-phase/quadrature (I/Q) memory digital pre-distortion (mDPD) circuit configured to compensate for I/Q errors in a transmission path through the PA.

10. The RF circuit of claim 9, wherein the adaptive I/Q mDPD circuit is adapted in conjunction with the adaptive frequency equalizer to correct the voltage tracking error in the envelope tracked power signal.

11. A method for correcting errors in wide modulation bandwidth envelope tracking (ET), the method comprising:
    receiving a modulated target voltage signal;
    providing an envelope tracked power signal using an ET integrated circuit (ETIC) for a power amplifier (PA) based on the modulated target voltage signal;
    generating an error correcting signal as a function of the modulated target voltage signal, a current through the ETIC, and a voltage representative of the envelope tracked power signal at the PA; and
    injecting the error correcting signal into the ETIC, the error correcting signal compensating for a voltage tracking error in the envelope tracked power signal due to a variable load impedance at the PA and a variable trace inductance between the ETIC and the PA.

12. The method of claim 11, wherein the error correcting signal is generated from a transfer function (H(s)) for a voltage of the envelope tracked power signal at the PA ($V_{ccPA}$) as a function of the modulated target voltage signal ($V_{ccideal}$).

13. The method of claim 12, wherein the transfer function compensates for a source impedance ($Z_{source}$) for the PA as a function of changes in a PA resistance ($R_{Icc}$) and a delay in the modulated target voltage signal ($V_{ccideal}$) through the ETIC.

14. The method of claim 13, further comprising:
    estimating changes in the PA resistance by comparing the voltage representative of the envelope tracked power signal with a voltage derived from the current through the ETIC and a representation of the PA resistance; and
    adjusting the transfer function from the estimated changes in the PA resistance.

15. The method of claim 13, wherein the transfer function (H(s)) is calculated from:

$$\frac{V_{ccPA}}{V_{ccideal}} = H(s) * AAF(s) *$$

$$trkamp(s) * \frac{Z_{ltrace}/Z_{ETIC}}{Z_{ltrace} * Z_{zout}} Z_{source} - \frac{Z_{source}}{R_{Icc}} e^{-j\omega * delay}$$

wherein AAF(s) is a transfer function of an anti-aliasing filter, trkamp(s) is a transfer function of a tracking amplifier, $Z_{ltrace}$ corresponds to the variable trace inductance, $Z_{ETIC}$ is an impedance of the ETIC, and $Z_{zout}$ is an output impedance of the ETIC.

16. The method of claim 11, further comprising generating the error correcting signal from a first transfer function ($H_1(s)$) comprising a frequency filter and a second transfer function ($H_2(s)$) which compensates for a source impedance ($Z_{source}$) for the PA as a function of changes in a PA resistance ($R_{Icc}$).

17. The method of claim 16, wherein the first transfer function ($H_1(s)$) is set to achieve a desired frequency response of the envelope tracked power signal as ($V_{ccPA}$) a function of the modulated target voltage signal ($V_{ccideal}$).

18. The method of claim 17, wherein the first transfer function ($H_1(s)$) and the second transfer function ($H_2(s)$) are calculated from:

$$\frac{V_{ccPA}}{V_{ccideal}} = H_1(s) * AAF(s) * trkamp(s) * \frac{\frac{Z_{ltrace}}{Z_{ETIC}}}{Z_{ltrace} * Z_{zout}} Z_{source} - \frac{Z_{source}}{R_{Icc}} e^{-j\omega * delay} + H_2(s) * AAF(s) * trkamp(s) * \frac{\frac{Z_{ltrace}}{Z_{ETIC}}}{Z_{ltrace} * Z_{zout}} Z_{source} - \frac{Z_{source}}{R_{Icc}} e^{-j\omega * delay}$$

wherein $AAF(s)$ is a transfer function of an anti-aliasing filter, $trkamp(s)$ is a transfer function of a tracking amplifier, $Z_{ltrace}$ corresponds to the variable trace inductance, $Z_{ETIC}$ is an impedance of the ETIC, $Z_{zout}$ is an output impedance of the ETIC, and the delay is a delay in the modulated target voltage signal ($V_{ccideal}$) through the ETIC.

19. A radio frequency (RF) circuit, comprising:
a power supply;
transmitter control circuitry configured to provide a modulated target voltage signal;
an envelope tracking integrated circuit (ETIC) coupled to the power supply and configured to provide an envelope tracked power signal to a power amplifier (PA) as a function of the modulated target voltage signal; and
an adaptive frequency equalizer coupled to the modulated target voltage signal and configured to inject an error correcting signal into the ETIC, the error correcting signal compensating for a voltage tracking error in the envelope tracked power signal due to a variable load impedance at the PA and a variable trace inductance between the ETIC and the PA;
wherein the adaptive frequency equalizer defines a transfer function to compensate for the voltage tracking error in the envelope tracked power signal.

20. The RF circuit of claim 19, further comprising a signal processing circuit configured to generate an RF amplifier input signal to be amplified by the PA using the envelope tracked power signal;
wherein:
the signal processing circuit comprises an adaptive in-phase/quadrature (I/Q) memory digital pre-distortion (mDPD) circuit configured to compensate for I/Q errors in a transmission path through the PA; and
the adaptive I/Q mDPD circuit is adapted in conjunction with the adaptive frequency equalizer to correct the voltage tracking error in the envelope tracked power signal.

* * * * *